US008563873B2

(12) United States Patent
Niki et al.

(10) Patent No.: US 8,563,873 B2
(45) Date of Patent: Oct. 22, 2013

(54) SUBSTRATE WITH METAL FILM AND METHOD FOR MANUFACTURING THE SAME

(75) Inventors: Ayao Niki, Ogaki (JP); Atsushi Ishida, Ibi-gun (JP); Ryojiro Tominaga, Ibi-gun (JP)

(73) Assignee: Ibiden Co., Ltd., Ogaki-shi (JP)

(*) Notice: Subject to any disclaimer, the term of this patent is extended or adjusted under 35 U.S.C. 154(b) by 600 days.

(21) Appl. No.: 12/607,666

(22) Filed: Oct. 28, 2009

(65) Prior Publication Data

US 2010/0243311 A1 Sep. 30, 2010

Related U.S. Application Data

(60) Provisional application No. 61/165,297, filed on Mar. 31, 2009.

(51) Int. Cl.
*H05K 1/11* (2006.01)
*C08F 2/46* (2006.01)
*C08J 7/18* (2006.01)

(52) U.S. Cl.
USPC .............. 174/266; 427/487; 427/510; 29/852

(58) Field of Classification Search
USPC .............................................. 29/852; 174/266
See application file for complete search history.

(56) References Cited

U.S. PATENT DOCUMENTS

| | | | | |
|---|---|---|---|---|
| 4,054,479 | A * | 10/1977 | Peiffer | 156/280 |
| 6,518,515 | B2 * | 2/2003 | Nishii et al. | 174/262 |
| 2005/0039948 | A1 * | 2/2005 | Asai et al. | 174/262 |
| 2007/0212883 | A1 * | 9/2007 | Kano et al. | 438/694 |
| 2007/0271783 | A1 * | 11/2007 | Ikeda | 29/852 |
| 2008/0029294 | A1 * | 2/2008 | Kawamura et al. | 174/261 |
| 2008/0038468 | A1 * | 2/2008 | Kawamura | 427/256 |
| 2008/0038672 | A1 * | 2/2008 | Yokokawa et al. | 430/311 |
| 2008/0093111 | A1 * | 4/2008 | Tsurumi | 174/257 |
| 2008/0096016 | A1 * | 4/2008 | Tsurumi | 428/344 |
| 2009/0008142 | A1 * | 1/2009 | Shimizu et al. | 174/261 |
| 2009/0022885 | A1 * | 1/2009 | Matsumoto et al. | 427/98.5 |
| 2009/0114432 | A1 * | 5/2009 | Tsurumi | 174/258 |
| 2009/0123642 | A1 * | 5/2009 | Sato | 427/98.5 |
| 2010/0243305 | A1 * | 9/2010 | Niki et al. | 174/258 |
| 2010/0323174 | A1 * | 12/2010 | Nagasaki et al. | 428/209 |
| 2011/0088934 | A1 * | 4/2011 | Kano et al. | 174/257 |
| 2011/0155441 | A1 * | 6/2011 | Tseng et al. | 174/266 |

FOREIGN PATENT DOCUMENTS

WO WO 2007/116057 A2 10/2007

* cited by examiner

*Primary Examiner* — Timothy Thompson
*Assistant Examiner* — Nathan Milakovich
(74) *Attorney, Agent, or Firm* — Oblon, Spivak, McClelland, Maier & Neustadt, L.L.P.

(57) ABSTRACT

A method for manufacturing a substrate with a metal film includes preparing a first insulation layer having first and second surfaces, forming a first conductive circuit on the first surface of the first insulation layer, forming on the first surface of the first insulation layer and on the first conductive circuit a second insulation layer having first and second surfaces, forming in the second insulation layer a penetrating hole tapering from the first surface toward the first conductive circuit, forming on the inner wall of the penetrating hole, a composition containing a polymerization initiator and a polymerizable compound, providing a polymer on the inner wall of the penetrating hole by irradiating the composition, applying a plating catalyst on the polymer, and forming a plated-metal film on the inner wall of the penetrating hole. The first surface of the first insulation layer faces the second surface of the second insulation layer.

20 Claims, 14 Drawing Sheets

SUBSTRATE WITH METAL FILM AND METHOD FOR MANUFACTURING THE SAME

CROSS-REFERENCE TO RELATED APPLICATIONS

The present application claims the benefits of priority to U.S. Application No. 61/165,297, filed Mar. 31, 2009. The contents of that application are incorporated herein by reference in their entirety.

BACKGROUND OF THE INVENTION

1. Field of the Invention

The present invention is related to a substrate with a metal film to be used in a printed wiring board, for example, and its manufacturing method.

2. Discussion of the Background

A printed wiring board has wiring made of copper, for example, and formed on a surface of an insulation layer made of epoxy resin or polyimide resin, for example. International Publication No. WO/2007/116057 A2 describes a method which includes the following: on a substrate, forming a polymer that is made up of carboxyl groups and adsorbs ions of a second metal; reducing the ions of the second metal to the second metal; and depositing a first metal onto the second metal. The contents of this publication are incorporated herein by reference in their entirety.

SUMMARY OF THE INVENTION

According to one aspect of the present invention, a method for manufacturing a substrate with a metal film includes preparing a first insulation layer having first and second surfaces, forming a first conductive circuit on the first surface of the first insulation layer, forming on the first surface of the first insulation layer and the first conductive circuit a second insulation layer having first and second surfaces such that the first surface of the first insulation layer faces the second surface of the second insulation layer, forming in the second insulation layer a penetrating hole which tapers from the first surface of the in the second insulation layer toward the first conductive circuit, providing on an inner wall of the penetrating hole a composition containing a polymerization initiator and a polymerizable compound, forming a polymer on the inner wall of the penetrating hole by irradiating the composition with an energy, applying a plating catalyst on the polymer, and forming a plated-metal film on the inner wall of the penetrating hole.

According to another aspect of the present invention, a method for manufacturing a substrate with a metal film includes preparing a first insulation layer having first and second surfaces, forming a first conductive circuit on the first surface of the first insulation layer, forming on the first surface of the first insulation layer and the first conductive circuit a second insulation layer having first and second surfaces such that the first surface of the first insulation layer faces the second surface of the second insulation layer, forming in the second insulation layer a penetrating hole which tapers from the first surface of the second insulation layer toward the first conductive circuit, irradiating an energy onto the first surface of the second insulation layer and an inner wall of the penetrating hole, providing on the inner wall of the penetrating hole a composition containing a polymerizable compound, forming a polymer on the inner wall of the penetrating hole by irradiating the composition with an energy, applying a plating catalyst on the polymer, and forming a plated-metal film on the inner wall of the penetrating hole.

According to yet another aspect of the present invention, a substrate with a metal film includes a first insulation layer having first and second surfaces, a first conductive circuit formed on the first surface of the first insulation layer, a second insulation layer formed on the first surface of the first insulation layer and the first conductive circuit and having first and second surfaces, the second insulation layer having a penetrating hole which tapers from the first surface of the second insulation layer toward the first conductive circuit, a polymer provided on an inner wall of the penetrating hole, and a plated-metal film formed on the inner wall of the penetrating hole.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
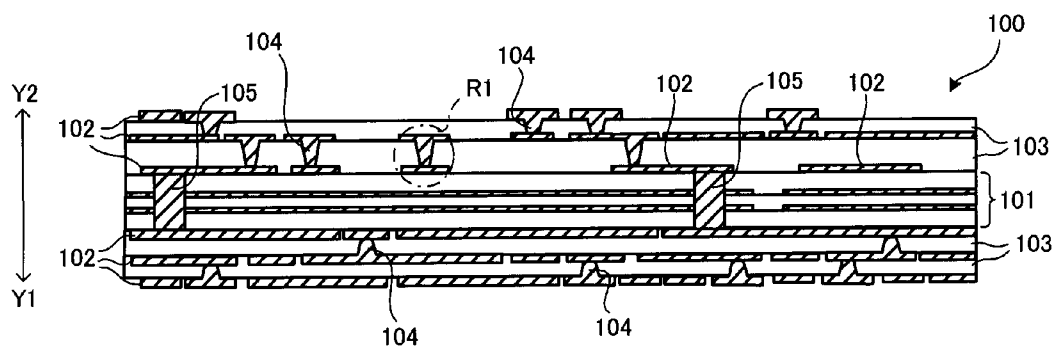
FIG. 1 is a view showing a substrate with a metal film according to the first embodiment of the present invention.

The embodiments will now be described with reference to the accompanying drawings, wherein like reference numerals designate corresponding or identical elements throughout the various drawings.

First Embodiment

Substrate 100 with a metal film according to the present embodiment is a so-called multilayer printed wiring board. More specifically, as shown in FIG. 1, for example, substrate 100 with a metal film is formed by alternately laminating wiring layers (conductive circuits) 102 and insulation layers 103 on both surfaces of core substrate 101. Core substrate 101 is made with, for example, a reinforcing material such as glass cloth, aramid non-woven fabric or glass non-woven fabric and resin. Wiring layer 102 is made of copper, for example. Also, insulation layer 103 is made with, for example, resin such as epoxy resin, polyimide resin or phenol resin and inorganic fillers.

Also, substrate 100 with a metal film has via conductor 104 and through-hole conductor 105 which provide electrical interlayer connections for multiple wiring layers 102. Each end of via conductor 104 and through-hole conductor 105 is connected to wiring layer 102 on the arrow-Y1 side and wiring layer 102 on the arrow-Y2 side respectively. Therefore, wiring layers 102 on the upper and lower sides are electrically connected.

Figure 2:
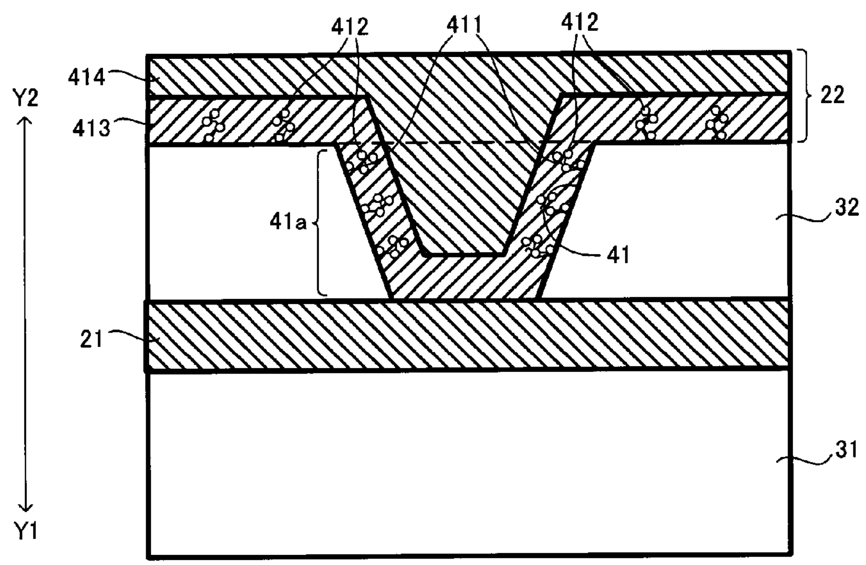
FIG. 2 is a magnified view showing part of FIG. 1.

FIG. 2 (magnified view of region (R1) in FIG. 1) shows a magnified view of one via conductor 104 (via hole 41). Via hole (penetrating hole) 41 is formed in second insulation layer 32. Second insulation layer 32 having a first surface (the surface on the arrow-Y2 side) and a second surface (the surface on the arrow-Y1 side) opposite the first surface is formed on first insulation layer 31 and first conductive circuit 21. More specifically, second insulation layer 32 is formed on the first surface of first insulation layer 31. The first surface of first insulation layer 31 faces the second surface of second insulation layer 32. First conductive circuit 21 is formed on the first surface (the surface on the arrow-Y2 side) of first insulation layer 31. Second conductive circuit 22 is formed on the first surface (the surface on the arrow-Y2 side) of second insulation layer 32. Via conductor (41*a*) is filled in via hole 41. Via conductor (41*a*) electrically connects first conductive circuit 21 (conductive pattern) and second conductive circuit 22 (conductive pattern).

Via hole 41 is a penetrating hole (opening) that penetrates second insulation layer 32 and reaches first conductive circuit 21. More specifically, the inner wall of via hole 41 tapers from the first surface (on the arrow-Y2 side) of second insulation layer 32 toward the second surface (on the arrow-Y1 side). Tapering from the first surface toward the second surface includes cases in which the penetrating hole (via hole 41) becomes gradually narrower from the first surface toward the second surface (first conductive circuit 21).

Via conductor (41*a*) has electroless plated-metal film 413 and electrolytic plated-metal film 414 on electroless plated-metal film 413. Graft polymer 411 is formed on the surface of second insulation layer 32 including the inner wall of via hole 41. Graft polymer 411 may also be referred to as a polymer or a polymer layer. The second surface of the second insulation layer and the inner wall of via hole 41 are preferred to be made smooth. However, if the roughness of the second surface is 0.25 μm (Ra) or less, the second surface is defined as being smooth in the present embodiment. On such surfaces, fine conductive circuits may be formed and high-speed signals (such as signals of 3 GHz or faster) may be transmitted. Moreover, the roughness of the second surface may be set at 0.01 μm-0.2 μm (Ra). Within such a range, adhesiveness is enhanced between the insulative substrate and the polymer on the insulative substrate, and the thickness of the polymer (polymer layer) may be set thinner. Graft polymer 411 contains a functional group bondable with catalyst 412 for depositing plating. Catalyst 412 is bonded to graft polymer 411. Electroless plated-metal film 413 is formed on the surface of second insulation layer 32 including the inner wall of via hole 41 as well as on first conductive circuit 21 exposed in via hole 41 so that the plated-metal film coats graft polymer 411 and catalyst 412. Electrolytic plated-metal film 414 is formed on the first surface (the surface on the arrow-Y2 side) of electroless plated-metal film 413. The hollow of via hole 41 is filled with electrolytic plated-metal film 414. Second conductive circuit 22 is made from electroless plated-metal film 413 and electrolytic plated-metal film 414. The detailed description of the material, quality and other factors of each portion will be provided later in the description of a manufacturing method. "Ra" indicates arithmetic average roughness, a parameter defined by the Japanese Industrial Standards (JIS).

Substrate 100 with a metal film (FIG. 1) may be manufactured according to a build-up process generally used for laminated wiring boards. However, in the present embodiment, via conductor 104 and wiring layer 102 made of copper, for example, are formed on second insulation layer 32 through a polymer layer. Accordingly, such a via conductor and conductive circuit firmly adhere to second insulation layer 32. In the following, a method for manufacturing substrate 100 with a metal film is described by focusing on region (R1) in FIG. 1 (the portion shown in FIG. 2).

Figure 3:
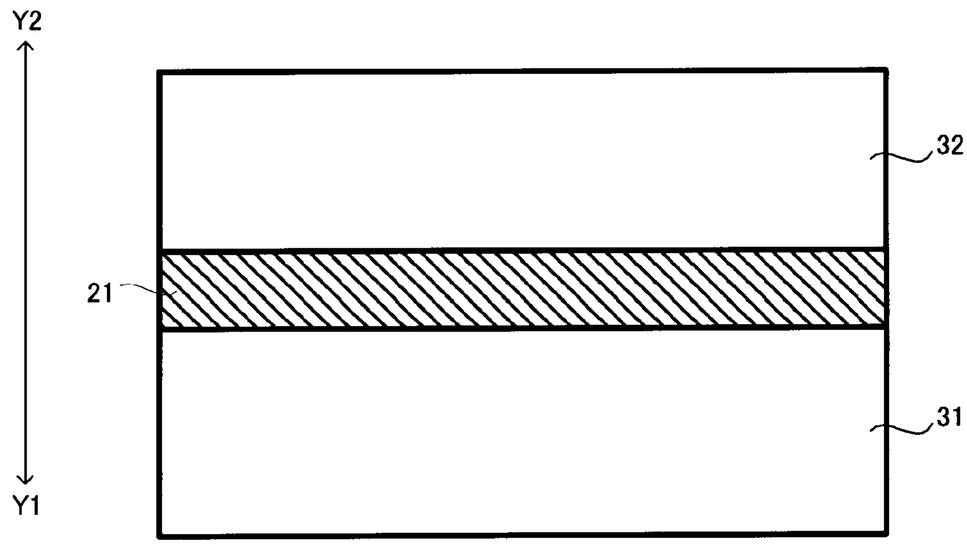
FIG. 3 is a view showing a laminate to be used for manufacturing a substrate with a metal film.

FIG. 1 shows a printed wiring board (substrate 100 with a metal film) of the present embodiment. Substrate 100 with a metal film may be manufactured through a generally used build-up process. For example, as shown in FIG. 3, second insulation layer 32 is formed on core substrate 101 (FIG. 1) having first conductive circuit 21. In the present embodiment, core substrate 101 corresponds to first insulation layer 31. Core substrate 101 has a first surface and a second surface opposite the first surface. First conductive circuit 21 is formed on the first surface of core substrate 101. Second insulation layer 32 has a first surface and a second surface opposite the first surface. Second insulation layer 32 is formed on the first surface of core substrate 101 and first conductive circuit 21. The first surface of core substrate 101 faces the second surface of second insulation layer 32. Second insulation layer 32 has a penetrating hole (via hole 41) for a via conductor. Via hole 41 tapers from the first surface of second insulation layer 32 toward first conductive circuit 21. The first surface of second insulation layer 32 and the inner wall of via hole 41 are made smooth.

The surface (the surface on the arrow-Y2 side) of second insulation layer 32 contains a functional group such as carboxy-alkyl group (—$(CH_2)_n$COOH). The functional group of second insulation layer 32 chemically bonds with an interaction group (functional group that interacts with metal ions or the like) of the polymer compound directly or by means of a backbone polymer compound. The material for second insulation layer 32 is preferred to be resin, but its thickness is not limited specifically. As a material for the second insulation layer, the following resins are effective: epoxy resin, polyimide resin, polyimide-amide resin, liquid-crystalline polymer, polyetherimide resin, polyether ether ketone resin, aramid resin, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal.

The material for the second insulation layer may be such as that containing the above resin and inorganic particles. $Al_2O_3$, MgO, Bn, AlN or $SiO_2$, for example, may be used for inorganic particles. In such a case, the amount of inorganic filler is preferred to be in the range of 30-60 wt. percent.

When forming a graft polymer on inorganic filler, for example, generally used silane coupling agents may be used. Silane coupling agents contain functional groups that chemically bond to organic materials such as vinyl groups, epoxy groups or methacrylate groups, as well as other functional groups that chemically bond to inorganic materials such as methoxy groups or ethoxy groups. Silane coupling agents form strong chemical bonds with hydroxyl groups (—OH) on the surface of inorganic material through hydrolysis or condensation reactions. Accordingly, a functional group that chemically bonds to organic materials such as vinyl groups or epoxy groups is attached to the surface of the inorganic filler, and thus the above-described graft polymer may be produced. When using insulation materials containing inorganic fillers that are already treated with a silane coupling agent, the above treatment using a silane coupling agent will not be required.

Figure 4:
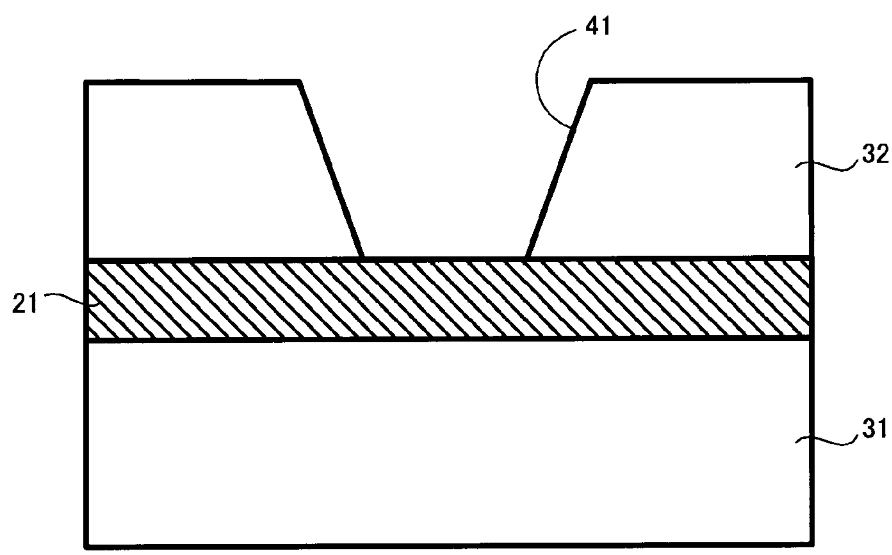
FIG. 4 is a view illustrating a step to form a via hole in an insulation layer.
Figure 5A:
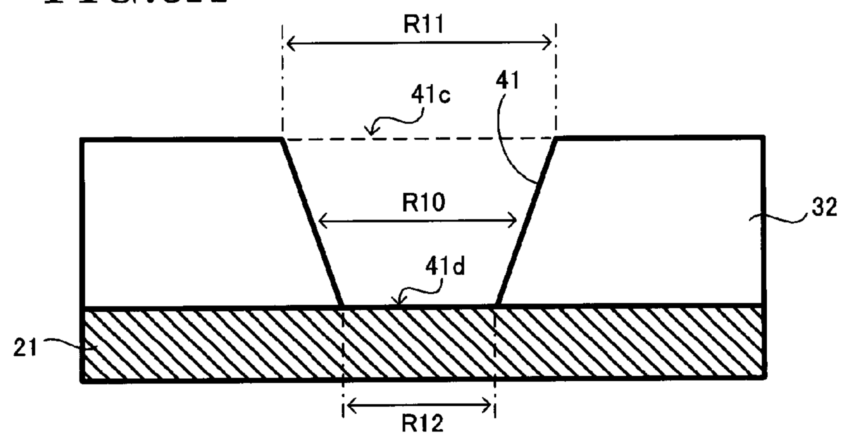
FIG. 5A is a cross-sectional view showing an example of a shape of a via hole.

Next, for example, a $CO_2$ laser is irradiated onto second insulation layer 32 by $CO_2$ laser processing equipment. In doing so, as shown in FIG. 4, via hole 41 reaching first conductive circuit 21 is formed in second insulation layer 32. Via hole 41 decreases its diameter toward first conductive circuit 21 (the arrow-Y1 side). More specifically, the inner wall of via hole 41 tapers by inclining inward from the flat first surface of second insulation layer 32 toward first conductive circuit 21. As shown in FIG. 5A, top diameter (R11) of via hole 41 (the diameter of opening (41*c*) of via hole 41 on the first surface) is greater than bottom diameter (R12) of via hole 41 (the diameter of opening (41*d*) of via hole 41 on the upper surface of first conductive circuit 21). Also, distance (R10) from one side to the other side of the inner wall of via hole 41 becomes gradually smaller from the first surface toward first conductive circuit 21 (see FIG. 5A).

Figure 5B:
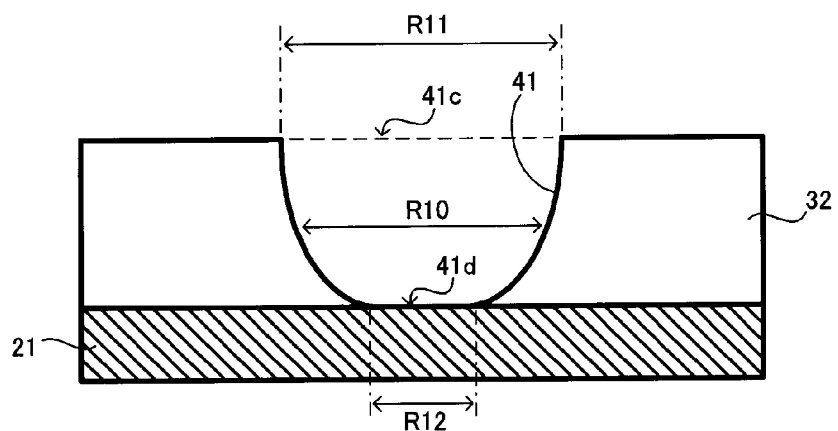
FIG. 5B is a cross-sectional view showing another example of a shape of a via hole.
Figure 6:
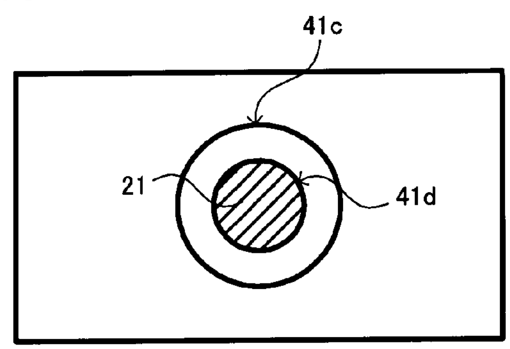
FIG. 6 is a view of a via hole seen from the first-surface side.

Here, the inner wall of via hole 41 may be curved as shown in FIG. 5B. In addition, opening (41*c*) on the first-surface side of via hole 41 and opening (41*d*) on the second-surface side are shaped to be circular (see FIG. 6). Opening (41*c*) of via hole 41 is formed on the first surface of second insulation layer 32. However, the openings are not limited to any specific shape; for example, they may be shaped to be polygons such as tetragons, hexagons or octagons. Also, opening (41*c*) and opening (41*d*) may be shaped differently.

Then, desmearing (removing smears) and soft etching are conducted. As for desmearing, dry desmearing such as sputtering is preferred. After that, according to requirements, surface modifications such as a plasma treatment or corona treatment may be performed on the surfaces (first and second surfaces) of insulative substrate 11 and the wall surfaces of first opening (12*a*) and second opening (12*b*).

Figure 7:
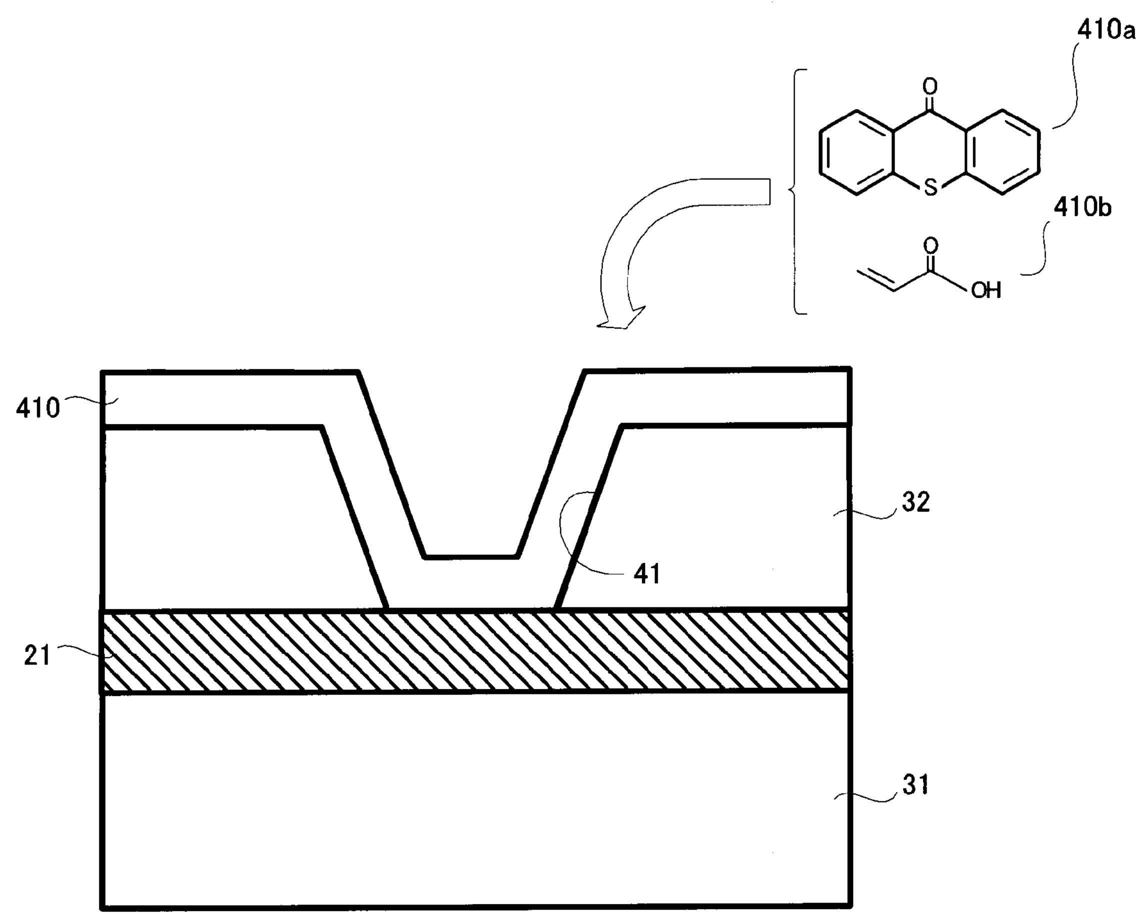
FIG. 7 is a view illustrating a step to apply a composition on a surface of the insulation layer including the inner wall of the via hole.

Next, polymerization initiator (410*a*) and polymerizable compound (410*b*) are dissolved in an appropriate solvent. Then, as shown in FIG. 7, composition 410 containing polymerization initiator (13*a*) and polymerizable compound (13*b*) is formed on the first surface of second insulation layer 32 including the inner wall of via hole 41. To form a composition on the surface of the substrate, for example, the substrate with via hole 41 may be immersed in a solution containing composition 410. Alternatively, composition 13 may be sprayed on the substrate, or composition 13 may be coated on the substrate.

Polymerization initiator (410*a*) is made from, for example, radical polymerization initiator 2-methyl-[4-(methylthio) phenyl]-2-morpholino-1-propanone. Polymerization initiator (410*a*) initiates polymerization in polymerizable compound (410*b*) when irradiated with energy such as UV (ultraviolet rays). Polymerizable compound (410*b*) is made from, for example, an acrylic acid monomer containing a terminal carboxyl group (—COOH). Polymerizable compound (410*b*) chemically bonds with second insulation layer 32 through polymerization reactions of carboxyl groups as interaction groups. Also, when composition 410 is irradiated with energy, polymerizable compound (410*b*) is activated by polymerization initiator (410*a*) and becomes a graft polymer. Depending on the graft polymer to be produced, the type (ingredients, concentration and so forth) of polymerizable compound (410*b*) may be selected accordingly. The solvent for composition 410 is any type of solution that dissolves polymerization initiator (410*a*) and polymerizable compound (410*b*). Solvents having a boiling point not too high, for example, approximately at 40-150° C. are preferred, since it is easier to dry such solvents.

Polymerization initiator (410*a*), polymerizable compound (410*b*) and the solvent are not limited specifically, and any kind may be used.

Polymerization initiator (13*a*) may be selected from among the following: acetophenones, ketones, benzoin ethers or benzyl ketals. As for acetophenones, for example, the following are effective: p-tert-butyl trichloro acetophenone, 2,2'-diethoxyacetophenone or 2-hydroxy-2-methyl-1-phenylpropane-1-one. As for ketones, for example, the following are effective: benzophenone, 4,4'-bis dimethylamino benzophenone, 2-chloro thioxanthone, 2-methyl thioxanthone, 2-ethyl thioxanthone or 2-isopropyl thioxanthone. As for benzoin ethers, for example, the following are effective: benzoin, benzoin methyl ether, benzoin isopropyl ether or benzoin isobutyl ether. As for benzyl ketals, the following are effective: benzyl dimethyl ketal or hydroxycyclohexyl phenyl ketone.

Polymerization initiator (410$a$) is not limited to radical polymerization initiators; for example, initiators of anionic polymerization or cationic polymerization may also be used. Moreover, as for polymerization initiator (13$a$), listed above are mainly photopolymerization initiators; however, other than such photopolymerization initiators, thermal polymerization initiators may also be used. As for thermal polymerization initiators, azo initiators, peroxides or the like may be listed. As for azo initiators, they are not limited specifically, and the following may be used: 2,2'-azobis(isobutyronitrile), 2,2'-azobis(isobutylate), 2,2'-azobis-2-methyl butyronitrile or the like. As for peroxides, they are not limited specifically, and the following may be used: benzoyl peroxide, acetyl peroxide, lauroyl peroxide or the like.

Polymerizable compound (410$b$) may be any of the following monomers or any combination of such: itaconic acid, 2-hydroxyethyl acrylate, acrylamide, N-monomethylol acrylamide, N-dimethylol acrylamide, allylamine, 3-vinyl propionate, vinyl sulfonic acid, 2-sulfoethyl acrylate, polyoxyethylene glycol monoacrylate, 2-acrylamido-2-methylpropane sulfonate, acid phosphoxy polyoxyethylene glycol monoacrylate or N-vinylpyrrolidone.

Polymerizable compound (410$b$) is not limited to monomers; for example, hydrophobic polymers having polymerizable groups in their molecules may be used. As for hydrophobic polymers, for example, the following may be effective: diene homopolymers such as polybutadiene; homopolymers containing allyl groups such as allyl acrylate; bidimensional or multidimensional copolymers such as styrene containing diene monomers; linear polymers or tridimensional polymers having carbon-carbon double bonds such as unsaturated polyester, high-density polyethylene or the like.

As for interaction groups of polymerizable compound (410$b$), other than carboxyl groups, functional groups such as the following may also be used: sulfonate groups, phosphate groups, amino groups, hydroxyl groups, amide groups, phosphine groups, imidazole groups, pyridine groups or ether groups.

As for solvents, any of the following or any combination of such is effective: acetone, methyl ethyl ketone, cyclohexane, ethyl acetate, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, methanol, ethanol, 1-methoxy-2-propanol, 3-methoxy propanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate or 3-methoxy propyl acetate.

After that, a heat treatment is conducted and such solvents are dried and removed. Also, the substrate is exposed to light to preliminarily cure the composition according to requirements.

Figure 8:
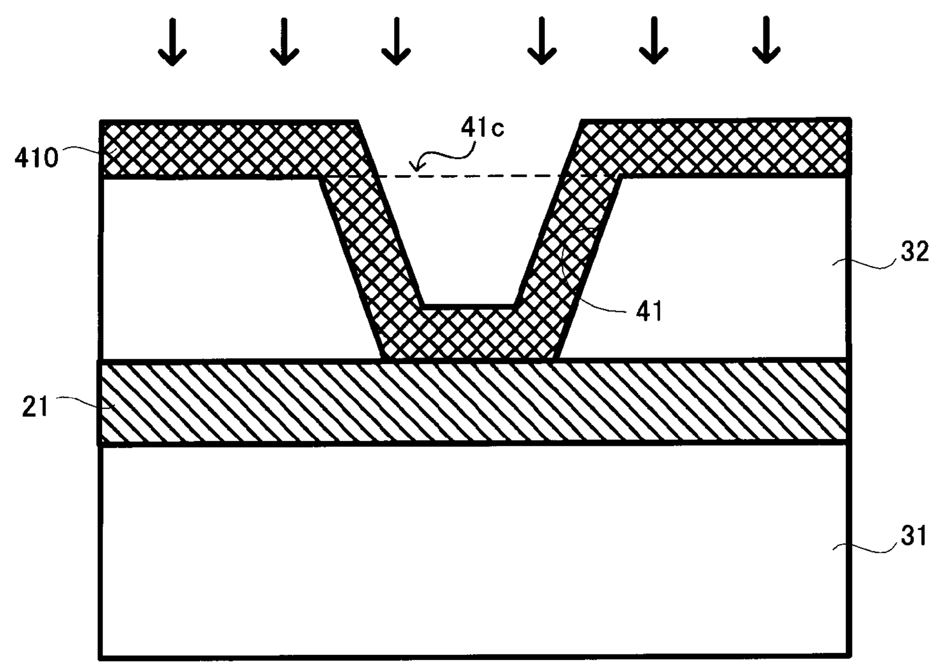
FIG. 8 is a view illustrating a step to irradiate the composition with energy.

Next, as shown in FIG. 8, using a UV lamp or the like, UV (ultraviolet rays) is irradiated onto the surface of second insulation layer 32 including the inner wall of via hole 41. During that time, since the inner wall of via hole 41 tapers inclining inward from the layer surface toward first conductive circuit 21, UV rays tend to be irradiated onto the entire inner-wall surface of via hole 41. More specifically, the inner-wall surface of via hole 41 is exposed through opening (41$c$) from the flat surface (first surface) of second insulation layer 32 to first conductive circuit 21. Therefore, UV rays are irradiated onto the entire inner-wall surface of via hole 41 in a substantially uniform manner. UV rays are preferred to be parallel and the direction to irradiate UV rays is preferred to be set perpendicular to the first surface of second insulation layer 32.

Energy irradiation is not limited to using UV rays. For example, other energy irradiation such as electron beams, X-rays, ion beams, far infrared rays, g-rays, i-rays, deep UV rays or high-density energy beams (laser beams) may also be used. Also, any energy source may be used; for example, energy sources such as mercury-vapor lamps, metal halide lamps, xenon lamps, chemical lamps or carbon arc lamps.

Figure 9A:
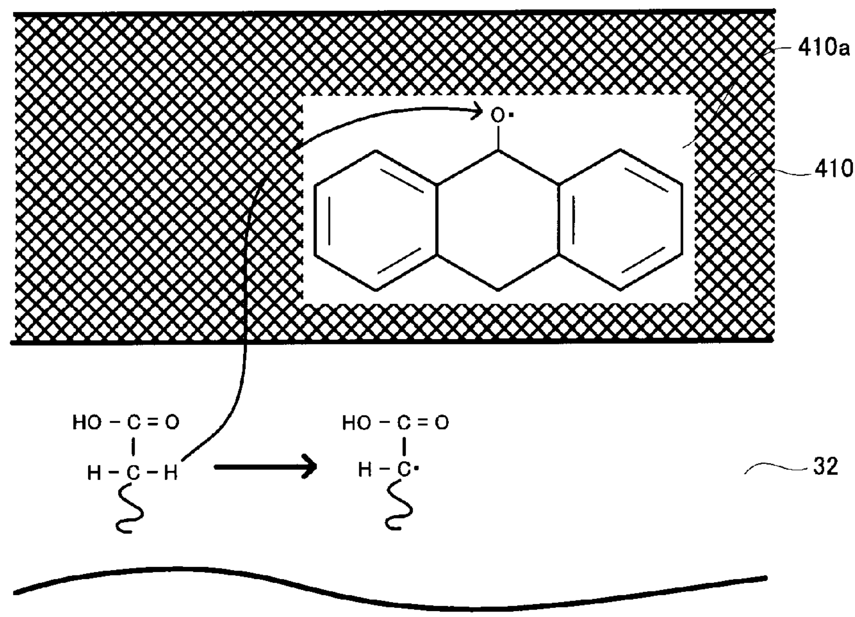
FIG. 9A is a view showing a process of how the surface of the insulation layer becomes activated when irradiated with energy.
Figure 9B:
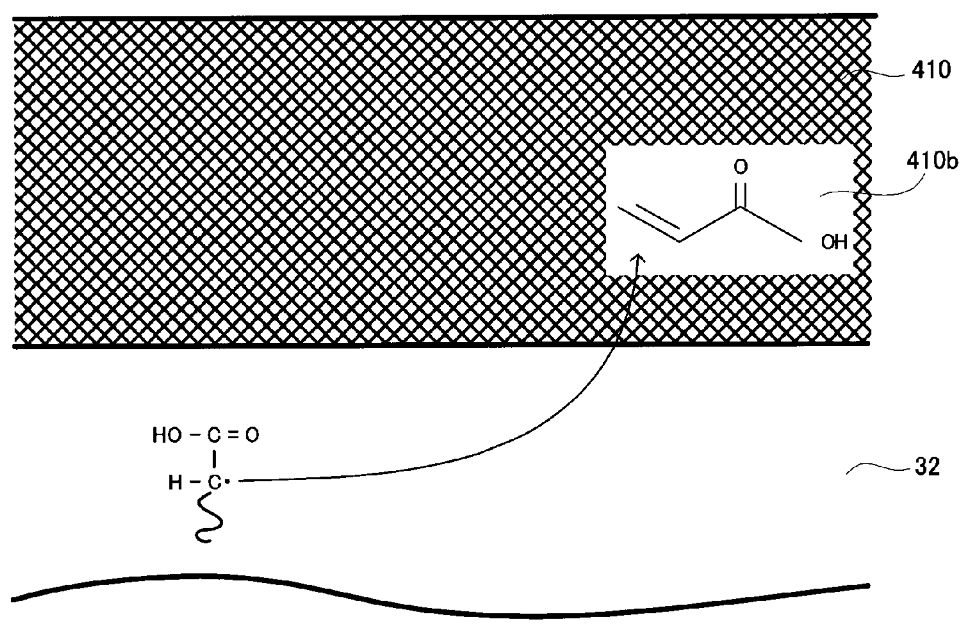
FIG. 9B is a view showing a process of how the insulation layer bonds with a polymerizable compound when irradiated with energy.
Figure 10:
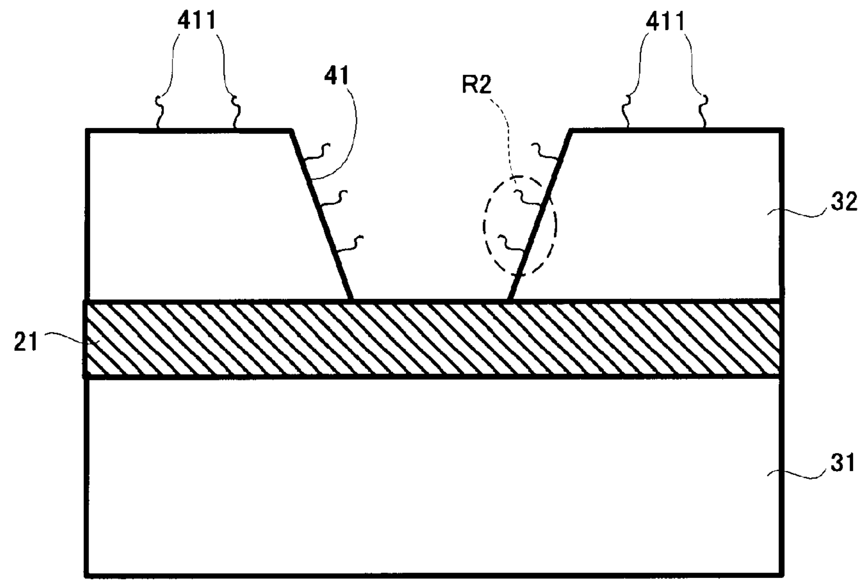
FIG. 10 is a view showing the insulation layer where a graft polymer is produced.

When composition 410 is irradiated with energy (UV), a radical (active species) is produced as shown in FIG. 9A, for example. Then, by activated polymerization initiator (410$a$), hydrogen is removed from the functional group (—$CH_2COOH$) on the surface of second insulation layer 32, and the surface of second insulation layer 32 becomes activated. Then, the activated functional group (—CH.COOH) reacts with the vinyl group ($H_2C$═CH—) of polymerizable compound (410$b$) (acrylic acid) as shown in FIG. 9B, for example. Second insulation layer 32 and polymerizable compound (410$b$) chemically bond through the reaction (coupling reaction/polymerization) of carboxy-alkyl group (—$CH_2COOH$) and vinyl group ($H_2C$═CH—). Accordingly, as shown in FIG. 10, for example, graft polymer 411 is produced on the surface of second insulation layer 32 including the inner wall of via hole 41. By the reactions described so far, it is thought that graft polymer 411 is produced on the first surface of second insulation layer 32 and the inner wall of via hole 41. Graft polymer 411 may also be referred to as a polymer or a polymer layer.

Also, the mechanism to produce graft polymer 14 may also be considered as follows: hydrogen is removed from polymerizable compound (13$b$) by activated polymerization initiator (13$a$), and polymerizable compound (13$b$) repeats the polymerization reaction within itself to produce polymer 17; as a result, the activated functional group (—CH.COOH) and polymer 17 are bonded to produce graft polymer 14 on the first surface of insulation layer 32 and the inner wall of the penetrating hole.

In coupling reactions, the following combinations are effective: (—COOH) with amines, (—COOH) with aziridines, (—COOH) with isocyanates, (—COOH) with epoxies, (—$NH_2$) with isocyanates, (—$NH_2$) with aldehydes, (—OH) with alcohols, (—OH) with halogen compounds, (—OH) with amines, (—OH) with acid anhydrides, or the like. Therefore, it is preferred that insulation layer 32 and polymerizable compound (13$b$) each contain a functional group, and that the functional group of insulation layer 32 and the functional group of polymerizable compound (13$b$) satisfy the above combinations. Also, as previously described, when surface modifications such as a plasma treatment or corona treatment are conducted after desmearing, it is thought that a radical is produced on the surface of the insulation layer. Then, it is thought that the radical reacts with polymerizable compound (13$b$) to form a graft polymer on the first surface of the insulation layer and inner wall of the penetrating hole. In such a case, composition 13 is made from a polymerizable compound. Composition 13 is not always required to contain polymerization initiator (13$a$).

In coupling reactions, the following combinations are effective: (—COOH) with amines, (—COOH) with aziridines, (—COOH) with isocyanates, (—COOH) with epoxys, (—$NH_2$) with isocyanates, (—$NH_2$) with aldehydes, (—OH)

with alcohols, (—OH) with halogen compounds, (—OH) with amines, (—OH) with acid anhydrides, or the like. Therefore, it is preferred that second insulation layer 32 and polymerizable compound (410*b*) each contain a functional group, and that the functional group of second insulation layer 32 and the functional group of polymerizable compound (410*b*) satisfy the above combinations.

Figure 11:
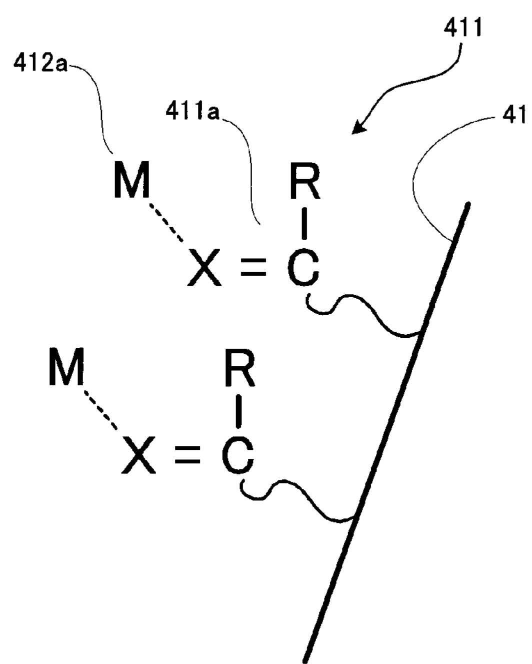
FIG. 11 is a magnified view showing part of FIG. 8.

In the following, as shown in FIG. 11 (a magnified view of region (R2) in FIG. 10), metal ions (412*a*) that function as catalyst 412 (see FIG. 12) for depositing electroless plated-metal film 413 (FIG. 2) (catalyst to initiate electroless plating) are applied to the first surface of second insulation layer 32 and the inner wall of via hole 41. More specifically, for example, the surface of second insulation layer 32 including the inner wall of via hole 41 is immersed in a palladium chloride solution (palladium ion concentration 0.1 M) and palladium ions as metal ions (412*a*) are attached to graft polymer 411.

Catalyst 412 is applied to the first surface of second insulation layer 32 and the inner wall of via hole 41 by means of graft polymer 411. Applying a catalyst on the surface of the insulative substrate includes applying metal ions that function as a catalyst and applying a compound containing a metal that functions as a catalyst. As for compounds containing metals that function as a catalyst, metal salts, complexes, complex ions or colloids may be listed.

Before applying a catalyst, the surface of first conductive circuit 21 exposed through via hole 41 may be etched. By depressing the surface of first conductive circuit 21 exposed through via hole 41 to make it lower than the surface of first conductive circuit 21 coated by second insulation layer 32, a polymer layer may be prevented from forming on the portion of first conductive circuit 21 exposed through via hole 41. Accordingly, connection reliability is enhanced between first conductive circuit 21 and via conductor (41*a*) (FIG. 2).

Graft polymer 411 contains functional group (411*a*) (—RCX) that is bondable to metal ion (412*a*) (and its metal salt). Namely, functional group (411*a*), containing negatively charged lone pairs of electrons, can adsorb positively charged metal ions (412*a*). Thus, by immersing the insulative substrate having the polymer on the first surface and inner wall of via hole 41 in a solution containing metal ions (412*a*), metal ions (412*a*) are adsorbed onto graft polymer 411. Since complex ions are ionized, they are adsorbed onto the polymer the same as metal ions, and charged colloids are also adsorbed onto the polymer the same as metal ions.

Metal salts form a coordinate bond with lone pairs of electrons of functional group (411*a*). Complexes form a coordinate bond with lone pairs of electrons of functional group (411*a*). Uncharged colloids form a coordinate bond with lone pairs of electrons of functional group (411*a*).

Through the mechanism described above, it is thought that catalysts, metal ions that function as a catalyst or compounds containing a metal that functions as a catalyst are adsorbed onto the graft polymer.

Functional group (411*a*) and metal ions (412*a*) are not limited to any specific type. As for functional group (411*a*), for example, hydrophilic groups such as carboxyl groups, sulfonyl groups or hydroxyl groups are effective. As for metal ions (412*a*), ions such as palladium, silver, copper, nickel, aluminum, iron, cobalt, gold or chrome are effective.

Also, application of metal ions (412*a*) is not limited to any specific method. For example, by pulverizing a metal salt into fine particles and applying them directly on the surface of second insulation layer 32, metal ions (412*a*) are adsorbed onto graft polymer 411. Alternatively, by dissolving the metal salt in a solvent and applying it on the surface of second insulation layer 32, the metal ions are adsorbed onto graft polymer 411.

Alternatively, instead of metal ions (412*a*), metal salts, complexes, complex ions or colloids may also be adsorbed.

Figure 12:
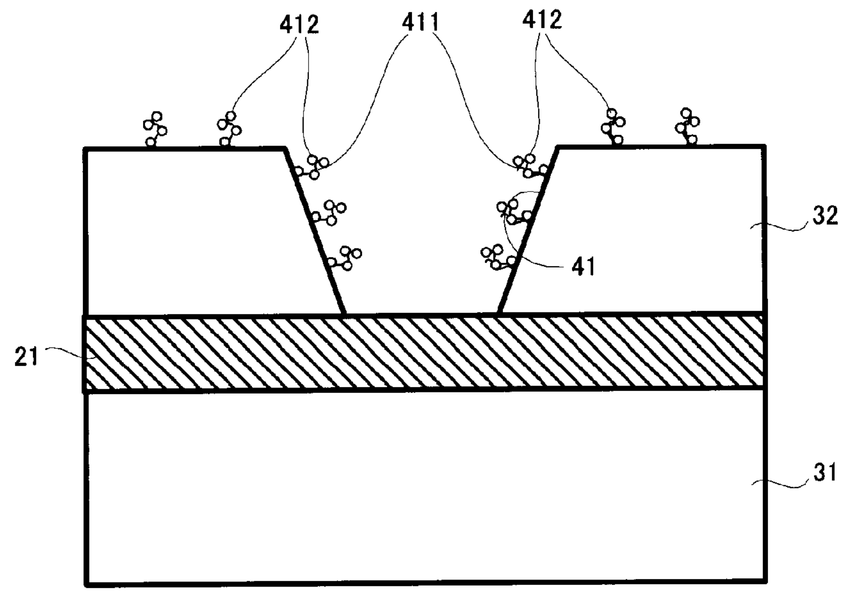
FIG. 12 is a view illustrating a step to form a metal by reducing metal ions.

After that, according to requirements, by washing with water the surface of second insulation layer 32 including the inner wall of via hole 41, excess metal ions (412*a*) are removed. Then, the insulative substrate with a catalyst is immersed in a solution containing a reducing agent. As shown in FIG. 12, metal ions (412*a*) are reduced to metal by the reducing agent, becoming catalyst 412 to initiate electroless plating. Metal ions (412*a*) adsorbed onto the surface of second insulation layer 32 are reduced to metal; and fine metal particles (catalyst 412) are deposited on the surface of insulation layer 32. As for reducing agents, at least one kind selected from among the following or its salts is preferred: hydrazines, tartaric acid, boron compounds, aldehydes, hypophosphorous acid, phosphinic acid or phosphorous acid. As for boron compounds, tetrahydro borates such as sodium tetrahydro borate; amine boranes such as trimethylamine borane or dimethylamine borane; or aldehydes such as formalin or acetaldehyde may be listed. In the present embodiment, hypophosphorous acid with a concentration of 1M is used.

When adding a reducing agent, any method may be used. For example, a reduction solution with a predetermined concentration may be applied or dripped directly onto the surface of second insulation layer 32.

Figure 13:
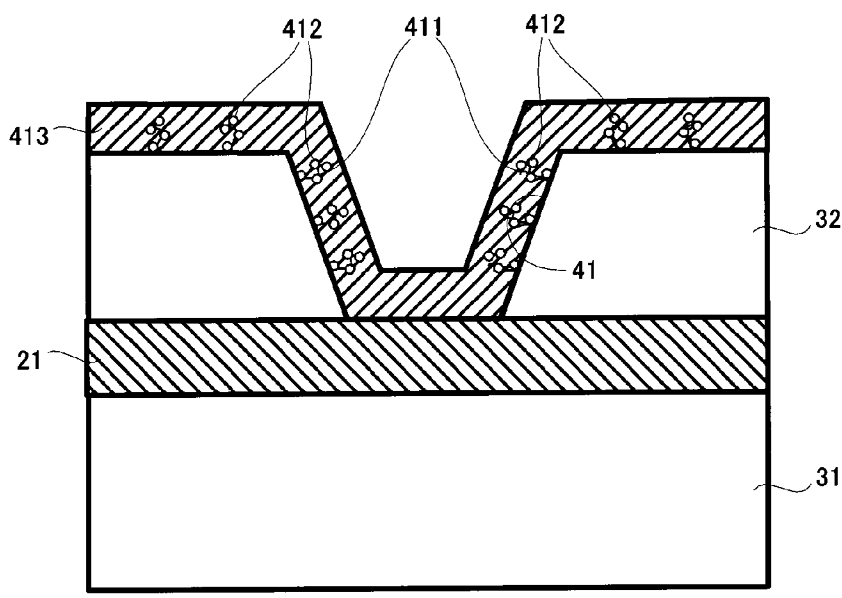
FIG. 13 is a view illustrating a step to form an electroless plated-metal film on the surface of the insulation layer including the inner wall of the via hole.

In the following, as shown in FIG. 13, electroless plated-metal film 413 (metal film) made of copper, for example, is formed on the surface of second insulation layer 32 including the inner wall of via hole 41. More specifically, the surface of second insulation layer 32 including the inner wall of via hole 41 is immersed in an electroless plating bath at a predetermined temperature for a predetermined time. Such plating will progress using catalyst 412 as nuclei. Accordingly, a strong bond (adhesion) is formed between second insulation layer 32 and electroless plated-metal film 413. In the present embodiment, the insulative substrate with a catalyst is immersed in an electroless copper plating solution (Thru-Cup) made by C. Uyemura Co., Ltd. to form electroless copper-plated film with a thickness of 0.3-3 μm on the surface of the insulative substrate. Such an electroless plating bath contains, for example, metal ions to be plated, a reducing agent and a stabilizer. However, the electroless plating bath is not limited to such, and any other kind may be used. As for metal ions to be plated, chrome, lead, nickel, gold, silver, tin or zinc may be used other than copper.

Next, using subtractive or semi-additive methods (for example, see guidebook for technologies of printed wiring boards, published by the Nikkan Kogyo Shimbun, Ltd.), via conductor (41*a*) and second conductive circuit 22 (FIG. 2) are formed. More specifically, using electroless plated-metal film 413 as a seed layer, for example, electrolytic plating is performed. Accordingly, via hole 41 is filled with electrolytic plated-metal film 414 while electrolytic plated-metal film 414 is formed on electroless plated-metal film 413. Then, a thermal treatment is conducted and by patterning electroless plated-metal film 413 and electrolytic plated-metal film 414, via conductor (41*a*) and second conductive circuit 22 are formed as shown in FIG. 2. Second conductive circuit 22 on the first surface of second insulation layer 32 is connected to first conductive circuit 21 on the first surface of first insulation layer 31 by means of via conductor (41*a*).

In the following, an electroplating method that can be employed in the present embodiment is shown with reference to FIGS. 14A and 14B.

First, a substrate with electroless plated-metal film 413 is immersed in electrolytic plating solution (414*a*). A commercially available electrolytic copper plating solution may be used for such an electrolytic plating solution. Then, as shown in FIG. 14A, insulative body 1000 is pressed against the first surface of second insulation layer 32. As for insulative body 1000, sponges or brushes may be used. Next, as shown in FIG. 14B, at least either the substrate or insulative body 1000 is shifted. Namely, the substrate and insulative body 1000 are shifted relative to each other.

At that time, using electroless plated-metal film 413 as a seed, electrolytic plated-metal film 414 is formed on electroless plated-metal film 413. A conductive layer made up of electroless plated-metal film 413 and electrolytic plated-metal film 414 on electroless plated-metal film 413 is formed on the first surface of second insulation layer 32. Electroless plated-metal film 413 and electrolytic plated-metal film 414 on electroless plated-metal film 413 are formed on the inner wall of via hole 41. Via hole 41 is filled with electrolytic plated-metal film 414, and via conductor (41*a*) is formed (see FIG. 2). In such electrolytic plating, electroless plated-metal film 413 is electroless copper-plated film and electrolytic plated-metal film 414 is electrolytic copper-plated film.

According to such a method, the thickness of the conductive layer formed on the first surface will be less than a layer formed by electroplating performed without using insulative body 1000. Also, since electrolytic plated-metal film 414 is formed while pressing insulative body 1000 against the polymer, adhesiveness tends to improve between the polymer and the conductive layer. Thus, the adhesiveness between the smooth first surface of second insulation layer 32 and a conductive layer will likely be enhanced. In addition, since the polymer layer has a lower elasticity modulus than the insulative substrate, insulative body 1000 tends to correspond to the surface of the insulative substrate. As a result, the thickness of the conductive layer formed on second insulation layer 32 positioned on the first surface of core substrate 101 will become substantially the same as the thickness of the conductive layer formed on second insulation layer 32 positioned on the second surface of core substrate 101. FIG. 1 shows an example in which second insulation layers 32 are formed on both surfaces of core substrate 101.

By repeating the above procedure the same number of times as a predetermined number of layers to be laminated, substrate 100 with a metal film is complete. Substrate 100 with a metal film will become a finished substrate after procedures such as exterior processing, warping correction, conductivity inspection, external appearance inspection and final inspection.

Second Embodiment

Sheet-type copper board 201 with a thickness of 0.2 mm is prepared as a support board. Copper board 201 has a first surface (the surface on the arrow-Y2 side) and a second surface (the surface on the arrow-Y1 side) opposite the first surface.

Figure 15A:
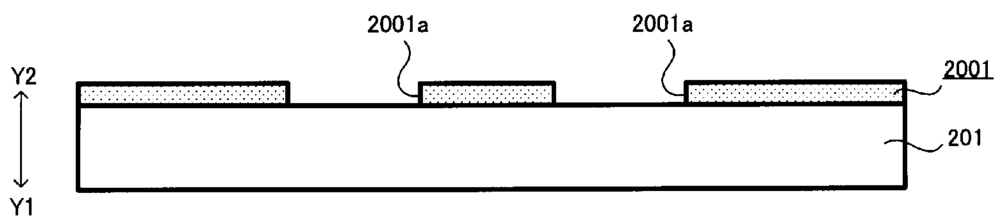
FIG. 15A is a view illustrating a first step of a method for manufacturing a substrate with a metal film according to the second embodiment of the present invention.

As shown in FIG. 15A, plating resist 2001 with opening (2001*a*) is formed on the first surface of copper board 201. The thickness of plating resist 2001 is preferred to be set at approximately 25-50 μm. In the Second Embodiment, the thickness is set at 30 μm.

Figure 15B:
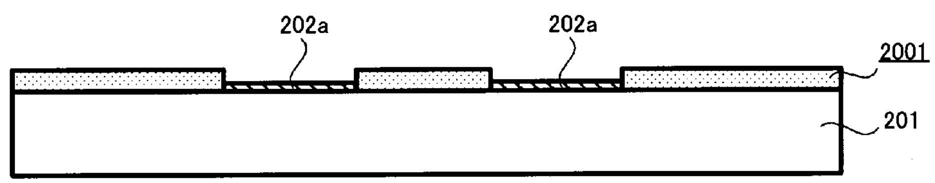
FIG. 15B is a view illustrating a second step of a method for manufacturing a substrate with a metal film according to the second embodiment.
Figure 15C:
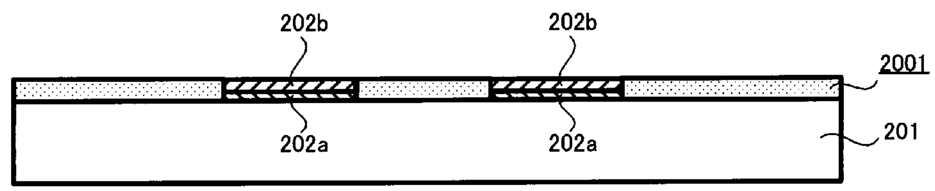
FIG. 15C is a view illustrating a third step of a method for manufacturing a substrate with a metal film according to the second embodiment.

Next, using copper board 201 as an electrode, metal layer (202*a*) is formed on copper board 201 exposed through opening (2001*a*) of plating resist 2001 by arranging a gold film, a palladium film and a nickel film in that order (FIG. 15B). After that, using copper board 201 as an electrode, electrolytic copper-plated film (202*b*) is formed on metal layer (202*a*) (FIG. 15C). Electrolytic copper-plated film (202*b*) functions as an electrode for connection with a motherboard or an electronic component.

Figure 15D:
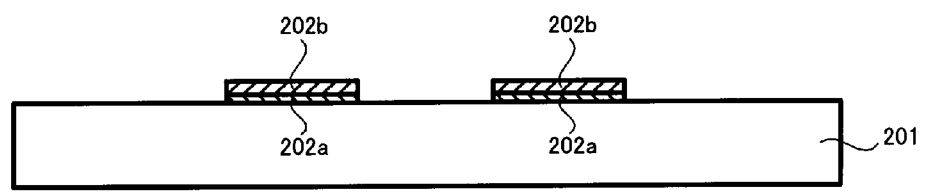
FIG. 15D is a view illustrating a fourth step of a method for manufacturing a substrate with a metal film according to the second embodiment.
Figure 16A:
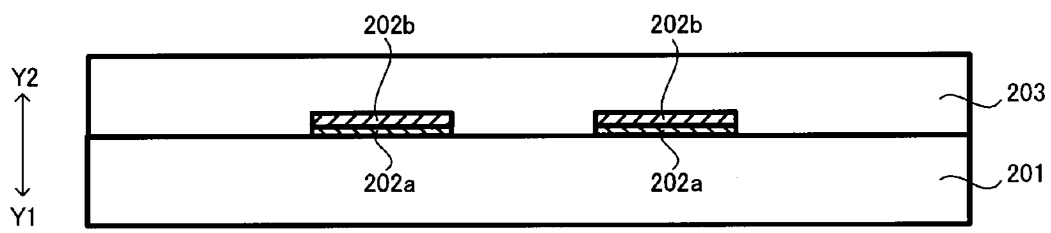
FIG. 16A is a view illustrating a fifth step of a method for manufacturing a substrate with a metal film according to the second embodiment.

Next, as shown in FIG. 15D, plating resist 2001 is removed. Then, a film for interlayer resin insulation layers is laminated on the first surface of copper board 201 and electrolytic copper-plated film (202*b*). By thermosetting the film, interlayer resin insulation layer 203 is formed on the first surface of copper board 201 and electrolytic copper-plated film (202*b*) (FIG. 16A). Interlayer resin insulation layer 203 corresponds to the first insulation layer. As for interlayer resin insulation layer 203, examples such as the following may be listed: insulation layers made with thermosetting resin and inorganic particles; insulation layers made with thermosetting resin and reinforcing material; or insulation layers made with thermosetting resin, inorganic particles and reinforcing material. As for such reinforcing material, glass cloth, glass non-woven fabric, aramid non-woven fabric or the like may be used. As for inorganic particles, particles such as those used in the above embodiment may be used. In the Second Embodiment, ABF film GX-13 made by Ajinomoto Fine-Techno Co., Inc. is used as interlayer resin insulation layer 203.

Interlayer resin insulation layer 203 has a first surface (the surface on the arrow-Y2 side) and a second surface (the surface on the arrow-Y1 side) opposite the first surface. The second surface of interlayer resin insulation layer 203 faces the first surface of copper board 201. The first surface of interlayer resin insulation layer 203 is made smooth.

Figure 16B:
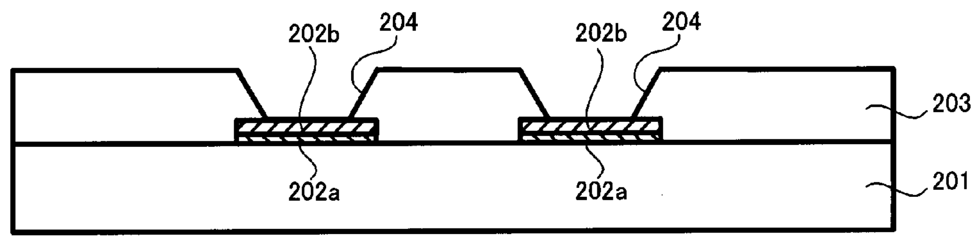
FIG. 16B is a view illustrating a sixth step of a method for manufacturing a substrate with a metal film according to the second embodiment.

Carbon-dioxide gas laser is beamed onto interlayer resin insulation layer 203 from the first-surface side of interlayer resin insulation layer 203. Via hole 204 reaching electrolytic copper-plated film (202*b*) is formed in interlayer resin insulation layer 203 (FIG. 16B). Via hole 204 tapers from the first surface of interlayer resin insulation layer 203 toward electrolytic copper-plated film (202*b*) (an electrode).

The rest of the process is substantially the same as in the First Embodiment. Dry desmearing is conducted to remove resin residue on the electrode surface exposed through via hole 204. Then, a polymer layer is formed on the first surface of interlayer resin insulation layer 203 and on the inner wall of via hole 204. After that, a catalyst is applied on the polymer layer. During that time, the catalyst is applied on the surfaces of the conductive circuit, the via conductor and the electrode exposed through via hole 204.

Figure 16C:
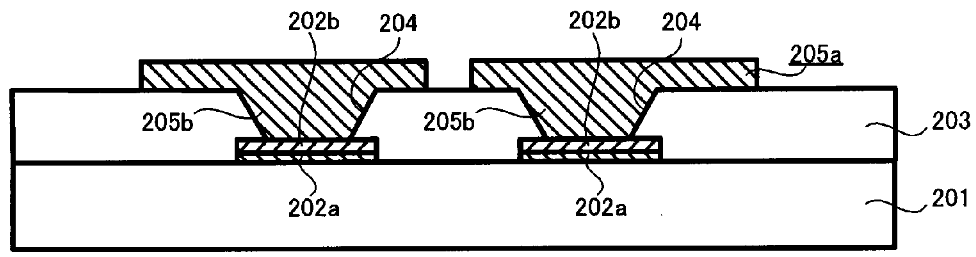
FIG. 16C is a view illustrating a seventh step of a method for manufacturing a substrate with a metal film according to the second embodiment.

Next, an electroless plated-metal film such as electroless copper-plated film is formed on the first surface of interlayer resin insulation layer 203, the inner wall of via hole 204 and the surface of an electrode (conductive circuit) exposed through via hole 204. First conductive circuit (205*a*) is formed on interlayer resin insulation layer 203 using a semi-additive method. At the same time, via conductor (205*b*) is formed by filling via hole 204 with the plated-metal film. The electrode (electrolytic copper-plated film (202*b*)) and first conductive circuit (205*a*) are connected by means of via conductor (205*b*) (see FIG. 16C).

Figure 14A:
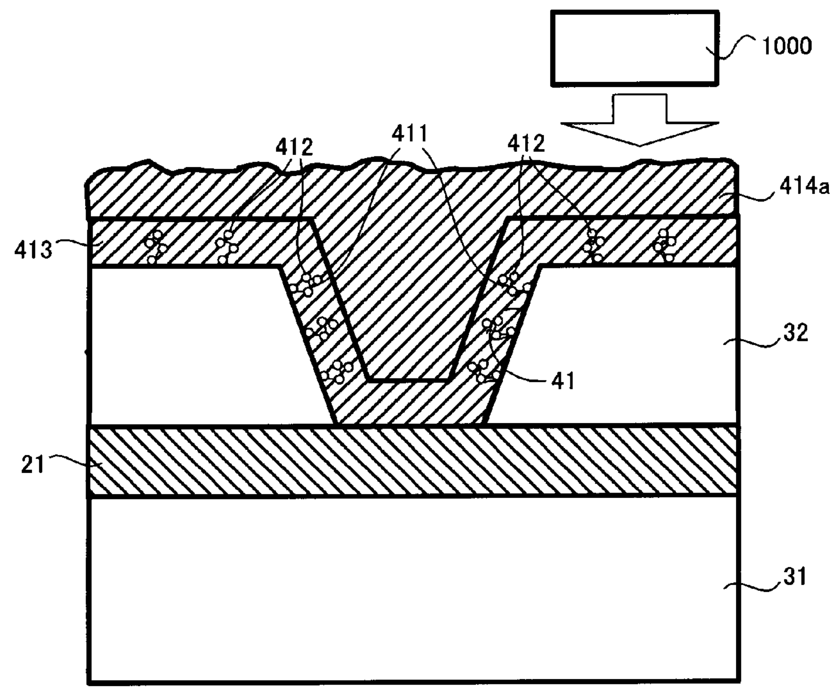
FIG. 14A is a view illustrating a first step of an electroplating method.
Figure 14B:
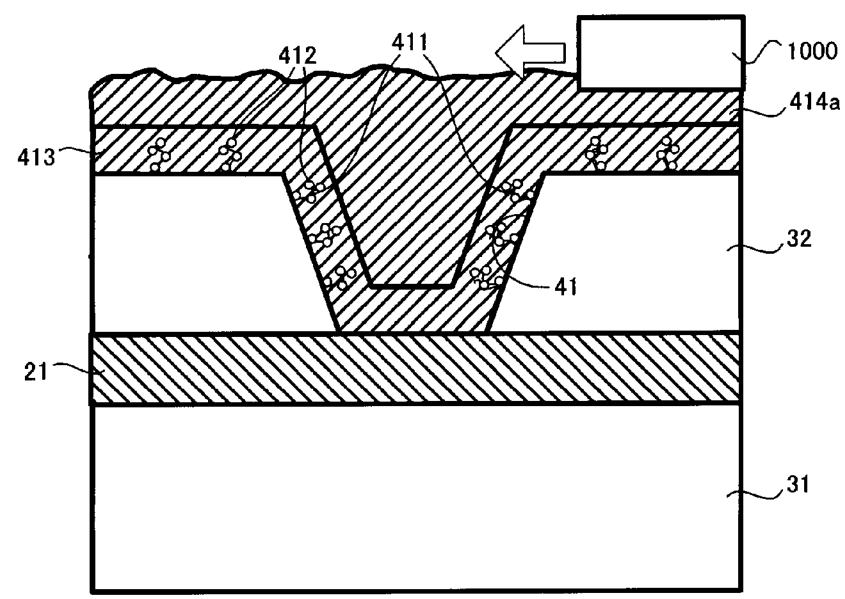
FIG. 14B is a view illustrating a second step of the electroplating method.

Also, first conductive circuit (205*a*) and via conductor (205*b*) may be formed using a method described by referring to FIGS. 14A and 14B.

Figure 17A:
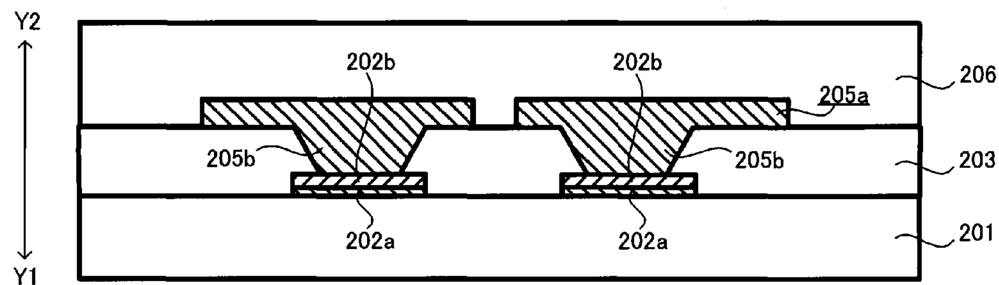
FIG. 17A is a view illustrating an eighth step of a method for manufacturing a substrate with a metal film according to the second embodiment.

Next, an Sn-plated film is formed on the surfaces of the first conductive circuit (205*a*) and via conductor (205*b*) (not shown in the drawing). The Sn-plated film may be formed by, for example, immersing the substrate in a solution containing approximately 5 percent of stannum and approximately 10 percent of thiocarbamide. At that time, the surfaces of first conductive circuit (205*a*) and via conductor (205*b*) are preferred to be made smooth. Interlayer resin insulation layer 206 (second insulation layer) is formed on the first surface of interlayer resin insulation layer 203, first conductive circuit (205*a*) and via conductor (205*b*) (FIG. 17A). Interlayer resin insulation layer 206 may be formed with the same material as interlayer resin insulation layer 203. Interlayer resin insulation layer 206 has a first surface (the surface on the arrow-Y2 side) and a second surface (the surface on the arrow-Y1 side) opposite the first surface. The first surface of interlayer resin insulation layer 203 faces the second surface of interlayer resin insulation layer 206. The second surface of interlayer resin insulation layer 206 is made smooth.

Figure 17B:
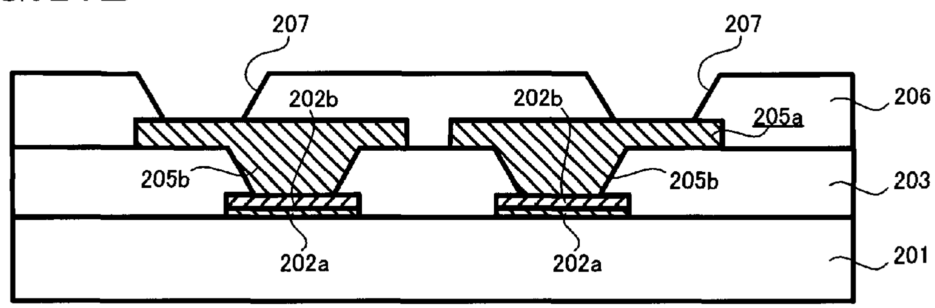
FIG. 17B is a view illustrating a ninth step of a method for manufacturing a substrate with a metal film according to the second embodiment.
Figure 17C:
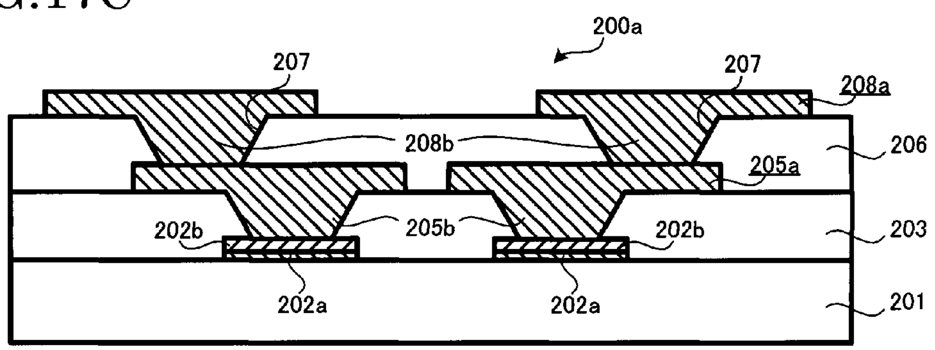
FIG. 17C is a view illustrating a tenth step of a method for manufacturing a substrate with a metal film according to the second embodiment.
Figure 18:
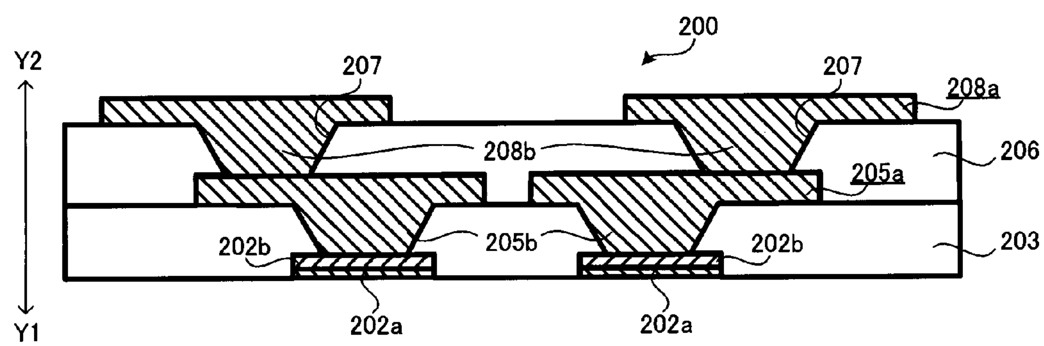
FIG. 18 is a view showing a substrate with a metal film according to the second embodiment of the present invention.

Using the same process shown in FIG. 16B, via hole 207 is formed in interlayer resin insulation layer 206 (FIG. 17B). Then, the same as in the process shown in FIG. 16C, conductive circuit (208*a*) is formed on the first surface of interlayer resin insulation layer 206 while via conductor (208*b*) is formed in via hole 207 (FIG. 17C). In doing so, intermediate substrate (200*a*) is completed. By etching away the support board (copper board 201) from intermediate substrate (200*a*), a printed wiring board (substrate 200 with a metal film) is completed (FIG. 18).

At that time, the Sn film exposed through via hole 207 is preferred to be removed using an etchant such as an alkaline solution. By doing so, connection reliability is enhanced between via conductor (208*b*) (second via conductor) and via conductor (205*b*) (first via conductor) or between via conductor (208*b*) (second via conductor) and first conductive circuit (205*a*).

Figure 19A:
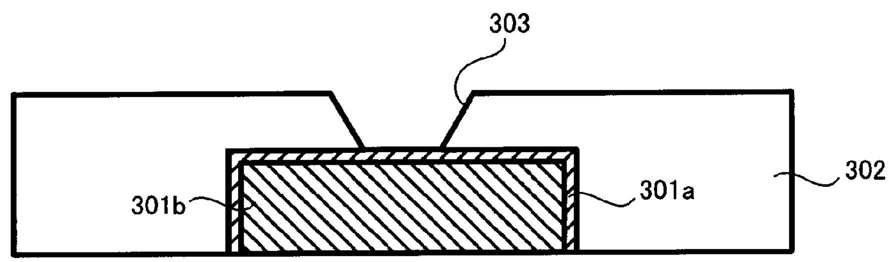
FIG. 19A is a view illustrating a first step to remove an Sn film exposed through a via hole in a method for manufacturing a substrate with a metal film.
Figure 19B:
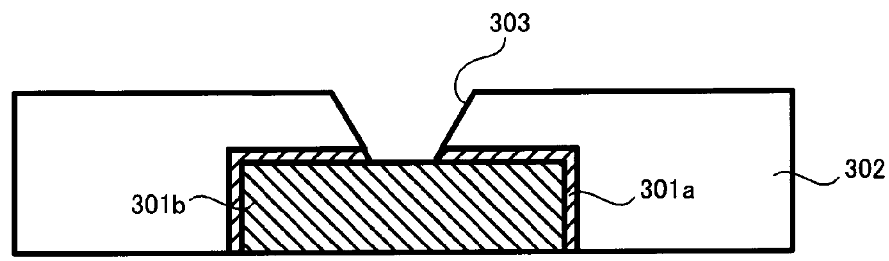
FIG. 19B is a view illustrating a second step to remove the Sn film exposed through the via hole in a method for manufacturing a substrate with a metal film.
Figure 19C:
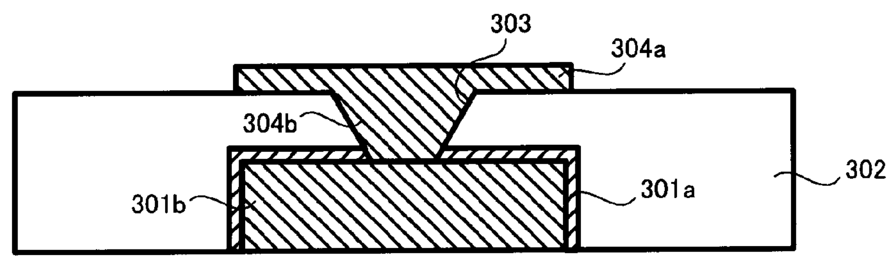
FIG. 19C is a view illustrating a third step to remove the Sn film exposed through the via hole in a method for manufacturing a substrate with a metal film.

FIGS. 19A-19C show an example in which the Sn film exposed through a via hole is removed. FIG. 19A shows a phase where via hole 303 is formed in insulation layer 302 coating conductor (301*b*) (such as a conductive circuit, via conductor or electrode) on whose surface Sn film (301*a*) is formed. FIG. 19B shows a phase where Sn film (301*a*) is removed from conductor (301*b*) exposed through via hole 303, and FIG. 19C shows that upper via conductor (304*b*) is directly connected to conductor (301*b*).

After the polymer layer is formed but before a catalyst is applied, the surface of conductor (301*b*) exposed through via hole 303 may be etched. By depressing the surface of conductor (301*b*) exposed through via hole 303 to make it lower than the surface of conductor (301*b*) coated by insulation layer 302, the polymer layer may be prevented from being formed on conductor (301*b*) exposed through via hole 303.

Conductor (301*b*) exposed through via hole 303 is left exposed by the polymer layer. Namely, the polymer layer is not formed on conductor (301*b*) exposed through via hole 303.

Since the inner wall of via hole 303 is tapered, the contact area of the polymer layer and the inner wall (side wall of the insulation layer) of the via hole increases. Therefore, adhesive strength is enhanced between the polymer layer and the inner wall of via hole 303.

According to the manufacturing method of the present embodiment, since the inner wall of the via hole is tapered, energy (such as UV rays) is irradiated onto the entire inner wall of via hole 41 in a substantially uniform manner. UV rays to be irradiated are preferred to be parallel rays. By irradiating parallel rays once from a direction perpendicular to the first surface of the insulation layer, the entire inner wall of the via hole is irradiated with UV rays in a substantially uniform manner. Accordingly, in the First Embodiment, for example, excellent adhesion between electroless plated-metal film 413 and second insulation layer 32 may be achieved by means of the polymer layer. The first conductive circuit exposed through a penetrating hole formed in the second insulation layer is preferred to be exposed. Namely, the polymer layer is formed on the first surface of the second insulation layer and the inner wall of a penetrating hole, but it is preferred that the polymer layer not be formed on the surface of the first conductive circuit exposed through the penetrating hole formed in the second insulation layer.

Moreover, in the manufacturing method of the present embodiment, electroless plated-metal film 413 is formed using catalyst 412 attached to graft polymer 411 as the nuclei for electroless plating. Thus, excellent adhesion is achieved between second insulation layer 32 and the metal film (electroless plated-metal film 413) despite the smooth surface of second insulation layer 32.

In the above embodiments, the quality, size and the number of layers of each layer may be modified freely.

The order of the steps in the above embodiments may be changed unless such a change deviates from the gist of the present invention. Also, some steps may be omitted according to usage requirements or others.

A method for manufacturing a substrate with a metal film according to the first aspect of the present invention is as follows: preparing a first insulation layer having a first surface and a second surface opposite the first surface; forming a first conductive circuit on the first surface of the first insulation layer; on the first surface of the first insulation layer and on the first conductive circuit, forming a second insulation layer having a first surface and a second surface opposite the first surface; in the second insulation layer, forming a penetrating hole that tapers from the first surface toward the first conductive circuit; on the inner wall of the penetrating hole, forming a composition containing a polymerization initiator and a polymerizable compound; by irradiating the composition with energy, forming a polymer on the inner wall of the penetrating hole; applying a plating catalyst on the polymer; and forming a plated-metal film on the inner wall of the penetrating hole. In such a substrate with a metal film, the first surface of the first insulation layer faces the second surface of the second insulation layer.

A method for manufacturing a substrate with a metal film according to the second aspect of the present invention is as follows: preparing a first insulation layer having a first surface and a second surface opposite the first surface; forming a first conductive circuit on the first surface of the first insulation layer; on the first surface of the first insulation layer and on the first conductive circuit, forming a second insulation layer having a first surface and a second surface opposite the first surface; in the second insulation layer, forming a penetrating hole that tapers from the first surface toward the first conductive circuit; irradiating energy onto the first surface of the second insulation layer and the inner wall of the penetrating hole; on the inner wall of the penetrating hole, forming a composition containing a polymerizable compound; by irradiating the composition with energy, forming a polymer on the inner wall of the penetrating hole; applying a plating catalyst on the polymer; and forming a plated-metal film on the inner wall of the penetrating hole. In such a substrate with a metal film, the first surface of the first insulation layer faces the second surface of the second insulation layer.

"Preparing" includes cases in which a worker purchases materials and components and manufactures a substrate himself, as well as cases in which the worker purchases a finished substrate and uses it. In addition, irradiation of energy includes irradiating electromagnetic beams, and other types of light such as electron beams, X-rays, plasma beams, corona discharge or ion beams. In short, it is sufficient if energy is irradiated in a predetermined direction.

A substrate with a metal film according to the third aspect of the present invention is formed with the following: a first insulation layer having a first surface and a second surface opposite the first surface; a first conductive circuit formed on the first surface of the first insulation layer; a second insulation layer, formed on the first surface of the first insulation layer and on the first conductive circuit, having a first surface and a second surface opposite the first surface as well as having a penetrating hole that tapers from the first surface toward the first conductive circuit; a polymer formed on the inner wall of the penetrating hole; and a plated-metal film formed on the inner wall of the penetrating hole.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a substrate with a metal film, comprising:

preparing a first insulation layer having a first surface and a second surface on an opposite side of the first surface;

forming a first conductive circuit on the first surface of the first insulation layer;

forming on the first surface of the first insulation layer and the first conductive circuit a second insulation layer having a first surface and a second surface on an opposite side of the first surface of the second insulation layer such that the first surface of the first insulation layer faces the second surface of the second insulation layer;

forming in the second insulation layer a penetrating hole which tapers from the first surface of the second insulation layer toward the first conductive circuit;

applying on an inner wall of the penetrating hole a composition comprising a polymerization initiator, a polymerizable compound and a solvent dissolving the polymerization initiator and the polymerizable compound such that a layer comprising the polymerization initiator and the polymerizable compound is formed on the inner wall of the penetrating hole;

irradiating the layer comprising the polymerization initiator and the polymerizable compound with an energy such that a polymer is formed on the inner wall of the penetrating hole;

applying a plating catalyst on the polymer; and forming a plated-metal film on the inner wall of the penetrating hole.

2. The method for manufacturing a substrate with a metal film according to claim 1, further comprising performing a plasma treatment on the inner wall of the penetrating hole.

3. The method for manufacturing a substrate with a metal film according to claim 1, wherein the forming of the polymer comprises forming a polymer comprising a functional group bonded to the catalyst.

4. The method for manufacturing a substrate with a metal film according to claim 1, wherein the forming of the polymer comprises irradiating the composition with UV rays.

5. The method for manufacturing a substrate with a metal film according to claim 1, wherein the first surface of the second insulation layer are made smooth and the plated-metal film is formed on the first surface of the second insulation layer.

6. The method for manufacturing a substrate with a metal film according to claim 1, wherein the plated-metal film comprises an electroless plated-metal film.

7. The method for manufacturing a substrate with a metal film according to claim 6, further comprising forming an electrolytic plated-metal film on the electroless plated-metal film.

8. The method for manufacturing a substrate with a metal film according to claim 7, wherein the electrolytic plated-metal film fills the penetrating hole.

9. A method for manufacturing a substrate with a metal film, comprising:

preparing a first insulation layer having a first surface and a second surface on an opposite side of the first surface;

forming a first conductive circuit on the first surface of the first insulation layer;

forming on the first surface of the first insulation layer and the first conductive circuit a second insulation layer having a first surface and a second surface on an opposite side of the first surface of the second insulation layer such that the first surface of the first insulation layer faces the second surface of the second insulation layer;

forming in the second insulation layer a penetrating hole which tapers from the first surface of the second insulation layer toward the first conductive circuit;

irradiating an energy onto the first surface of the second insulation layer and an inner wall of the penetrating hole;

applying on the inner wall of the penetrating hole a composition comprising a polymerizable compound and a solvent dissolving the polymerizable compound such that a layer comprising the polymerizable compound is formed on the inner wall of the penetrating hole;

irradiating the layer comprising the polymerizable compound with an energy such that a polymer is formed on the inner wall of the penetrating hole;

applying a plating catalyst on the polymer; and forming a plated-metal film on the inner wall of the penetrating hole.

10. The method for manufacturing a substrate with a metal film according to claim 9, wherein the energy is provided by a plasma treatment or a corona treatment.

11. The method for manufacturing a substrate with a metal film according to claim 1, further comprising etching a portion of the first conductive circuit exposed by the penetrating hole such that the portion of the first conductive circuit exposed by the penetrating hole is depressed with respect to a surface of the first conductive circuit not exposed by the penetrating hole.

12. The method for manufacturing a substrate with a metal film according to claim 11, wherein the etching of the portion of the first conductive circuit exposed by the penetrating hole includes removing a portion of the layer comprising the polymerization initiator and the polymerizable compound formed on the portion of the first conductive circuit such that the portion of the first conductive circuit is exposed by the penetrating hole.

13. The method for manufacturing a substrate with a metal film according to claim 1, wherein the second insulation layer includes an inorganic filler treated with silane coupling agent.

14. The method for manufacturing a substrate with a metal film according to claim 1, wherein the second insulation layer includes an inorganic filler treated with silane coupling agent in an amount ranging from 30 wt. percent to 60 wt. percent.

15. The method for manufacturing a substrate with a metal film according to claim 1, further comprising desmearing the inner wall of the penetrating hole prior to the applying of the composition on the inner wall of the penetrating hole.

16. The method for manufacturing a substrate with a metal film according to claim 9, further comprising etching a portion of the first conductive circuit exposed by the penetrating hole such that the portion of the first conductive circuit exposed by the penetrating hole is depressed with respect to a surface of the first conductive circuit not exposed by the penetrating hole.

17. The method for manufacturing a substrate with a metal film according to claim 16, wherein the etching of the portion of the first conductive circuit exposed by the penetrating hole includes removing a portion of the layer comprising the polymerizable compound formed on the portion of the first conductive circuit such that the portion of the first conductive circuit is exposed by the penetrating hole.

18. The method for manufacturing a substrate with a metal film according to claim 9, wherein the second insulation layer includes an inorganic filler treated with silane coupling agent.

19. The method for manufacturing a substrate with a metal film according to claim 9, wherein the second insulation layer includes an inorganic filler treated with silane coupling agent in an amount ranging from 30 wt. percent to 60 wt. percent.

20. The method for manufacturing a substrate with a metal film according to claim 9, further comprising desmearing the inner wall of the penetrating hole prior to the applying of the composition on the inner wall of the penetrating hole.

* * * * *